(12) United States Patent
Chen

(10) Patent No.: US 8,493,806 B1
(45) Date of Patent: Jul. 23, 2013

(54) SENSE-AMPLIFIER CIRCUIT OF MEMORY AND CALIBRATING METHOD THEREOF

(75) Inventor: Shi-Wen Chen, Kaohsiung (TW)

(73) Assignee: United Microelectronics Corporation, Hsinchu (TW)

(*) Notice: Subject to any disclaimer, the term of this patent is extended or adjusted under 35 U.S.C. 154(b) by 75 days.

(21) Appl. No.: 13/342,253

(22) Filed: Jan. 3, 2012

(51) Int. Cl.
*G11C 7/02* (2006.01)

(52) U.S. Cl.
USPC ............... 365/207; 365/205; 365/189.09

(58) Field of Classification Search
USPC ............... 365/207, 205, 189.09, 189.11
See application file for complete search history.

(56) References Cited

U.S. PATENT DOCUMENTS

| | | | |
|---|---|---|---|
| 3,663,828 A | 5/1972 | Low | |
| 3,818,402 A | 6/1974 | Golaski | |
| 4,163,944 A | 8/1979 | Chambers | |
| 4,245,355 A | 1/1981 | Pascoe | |
| 4,400,796 A | 8/1983 | Closson et al. | |
| 4,409,608 A | 10/1983 | Yoder | |
| 4,816,784 A | 3/1989 | Rabjohn | |
| 5,159,205 A | 10/1992 | Gorecki | |
| 5,208,725 A | 5/1993 | Akcasu | |
| 5,212,653 A | 5/1993 | Tanaka | |
| 5,406,447 A | 4/1995 | Miyazaki | |
| 5,446,309 A | 8/1995 | Adachi | |
| 5,583,359 A | 12/1996 | Ng | |
| 5,637,900 A | 6/1997 | Ker | |
| 5,729,492 A | 3/1998 | Campardo | |
| 5,760,456 A | 6/1998 | Grzegorek | |
| 5,808,330 A | 9/1998 | Rostoker | |
| 5,923,225 A | 7/1999 | De Los Santos | |
| 5,959,820 A | 9/1999 | Ker | |
| 6,008,102 A | 12/1999 | Alford | |
| 6,081,146 A | 6/2000 | Shiochi | |
| 6,172,378 B1 | 1/2001 | Hull | |
| 6,194,739 B1 | 2/2001 | Ivanov | |
| 6,194,941 B1 | 2/2001 | Zarabadi et al. | |
| 6,246,271 B1 | 6/2001 | Takada | |
| 6,285,578 B1 | 9/2001 | Huang | |
| 6,291,872 B1 | 9/2001 | Wang | |
| 6,370,372 B1 | 4/2002 | Molnar | |
| 6,407,412 B1 | 6/2002 | Iniewski | |
| 6,427,226 B1 | 7/2002 | Mallick | |

(Continued)

OTHER PUBLICATIONS

Iida et al, "Offset Cancellation with Subthreshold-operated Feedback Circuit for Fully Differential Amplifiers", 2009, IEEE.

(Continued)

*Primary Examiner* — David Lam
(74) *Attorney, Agent, or Firm* — WPAT, PC; Justin King

(57) ABSTRACT

A sense-amplifier circuit of a memory, which includes a sense-amplifier unit, a first switch unit and a second switch unit. The sense-amplifier unit is constituted by a plurality of transistor switches and having a first, a second, a third and a fourth connection terminal. The first switch unit is configured to be parallel coupled between the first and second connection terminals of the sense-amplifier unit. The second switch unit is configured to be parallel coupled between the third and fourth connection terminals of the sense-amplifier unit. The first and second switch units each are constituted by a plurality of transistor switches coupled in parallel and are configured to control each of the parallel-coupled transistor switches on or off in the first and second switch units so as to calibrate a sensing range of the sense-amplifier unit. A calibrating method for a sense-amplifier circuit of a memory is also provided.

11 Claims, 7 Drawing Sheets

U.S. PATENT DOCUMENTS

| | | |
|---|---|---|
| 6,448,858 B1 | 9/2002 | Helms |
| 6,452,442 B1 | 9/2002 | Laude |
| 6,456,221 B2 | 9/2002 | Low |
| 6,461,914 B1 | 10/2002 | Roberts |
| 6,480,137 B2 | 11/2002 | Kulkarni |
| 6,483,188 B1 | 11/2002 | Yue |
| 6,486,765 B1 | 11/2002 | Katayanagi |
| 6,509,805 B2 | 1/2003 | Ochiai |
| 6,518,165 B1 | 2/2003 | Yoon et al. |
| 6,521,939 B1 | 2/2003 | Yeo |
| 6,545,547 B2 | 4/2003 | Fridi |
| 6,560,306 B1 | 5/2003 | Duffy |
| 6,588,002 B1 | 7/2003 | Lampaert |
| 6,593,838 B2 | 7/2003 | Yue |
| 6,603,360 B2 | 8/2003 | Kim |
| 6,608,363 B1 | 8/2003 | Fazelpour |
| 6,611,223 B2 | 8/2003 | Low |
| 6,625,077 B2 | 9/2003 | Chen |
| 6,630,897 B2 | 10/2003 | Low |
| 6,639,298 B2 | 10/2003 | Chaudhry |
| 6,653,868 B2 | 11/2003 | Oodaira |
| 6,668,358 B2 | 12/2003 | Friend |
| 6,700,771 B2 | 3/2004 | Bhattacharyya |
| 6,720,608 B2 | 4/2004 | Lee |
| 6,724,677 B1 | 4/2004 | Su |
| 6,756,656 B2 | 6/2004 | Lowther |
| 6,795,001 B2 | 9/2004 | Roza |
| 6,796,017 B2 | 9/2004 | Harding |
| 6,798,011 B2 | 9/2004 | Adan |
| 6,810,242 B2 | 10/2004 | Molnar |
| 6,822,282 B2 | 11/2004 | Randazzo |
| 6,822,312 B2 | 11/2004 | Sowlati |
| 6,833,756 B2 | 12/2004 | Ranganathan |
| 6,841,847 B2 | 1/2005 | Sia |
| 6,847,572 B2 | 1/2005 | Lee |
| 6,853,272 B1 | 2/2005 | Hughes |
| 6,876,056 B2 | 4/2005 | Tilmans |
| 6,885,534 B2 | 4/2005 | Ker |
| 6,901,126 B1 | 5/2005 | Gu |
| 6,905,889 B2 | 6/2005 | Lowther |
| 6,909,149 B2 | 6/2005 | Russ |
| 6,927,664 B2 | 8/2005 | Nakatani |
| 6,956,779 B2 * | 10/2005 | Tran .............................. 365/205 |
| 6,958,522 B2 | 10/2005 | Clevenger |
| 6,990,030 B2 | 1/2006 | Lemus et al. |
| 7,009,252 B2 | 3/2006 | Lin |
| 7,027,276 B2 | 4/2006 | Chen |
| 7,205,612 B2 | 4/2007 | Cai |
| 7,262,069 B2 | 8/2007 | Chung |
| 7,365,627 B2 | 4/2008 | Yen |
| 7,368,761 B1 | 5/2008 | Lai |
| 7,405,642 B1 | 7/2008 | Hsu |
| 7,672,100 B2 | 3/2010 | Van Camp |
| 7,872,676 B2 | 1/2011 | Olsen et al. |
| 2002/0019123 A1 | 2/2002 | Ma |
| 2002/0036545 A1 | 3/2002 | Fridi |
| 2002/0188920 A1 | 12/2002 | Lampaert |
| 2003/0076636 A1 | 4/2003 | Ker |
| 2003/0127691 A1 | 7/2003 | Yue |
| 2003/0173998 A1 | 9/2003 | Terzioglu et al. |
| 2003/0183403 A1 | 10/2003 | Kluge |
| 2005/0068112 A1 | 3/2005 | Glenn |
| 2005/0068113 A1 | 3/2005 | Glenn |
| 2005/0087787 A1 | 4/2005 | Ando |
| 2006/0006431 A1 | 1/2006 | Jean |
| 2006/0108694 A1 | 5/2006 | Hung |
| 2006/0267102 A1 | 11/2006 | Cheng |
| 2007/0024325 A1 | 2/2007 | Chen |
| 2007/0102745 A1 | 5/2007 | Hsu |
| 2007/0210416 A1 | 9/2007 | Hsu |
| 2007/0234554 A1 | 10/2007 | Hung |
| 2007/0246801 A1 | 10/2007 | Hung |
| 2007/0249294 A1 | 10/2007 | Wu |
| 2007/0296055 A1 | 12/2007 | Yen |
| 2008/0094166 A1 | 4/2008 | Hsu |
| 2008/0185679 A1 | 8/2008 | Hsu |
| 2008/0189662 A1 | 8/2008 | Nandy |
| 2008/0200132 A1 | 8/2008 | Hsu |
| 2008/0299738 A1 | 12/2008 | Hsu |
| 2008/0303623 A1 | 12/2008 | Hsu |
| 2009/0029324 A1 | 1/2009 | Clark |
| 2009/0079498 A1 | 3/2009 | Drost et al. |
| 2009/0201625 A1 | 8/2009 | Liao |
| 2010/0279484 A1 | 11/2010 | Wang |
| 2011/0051532 A1 | 3/2011 | Barth, Jr. et al. |

OTHER PUBLICATIONS

Lee et al, "A Bitline Sense Amplifier for Offset Compensation", 2010, IEEE International Solid-State Circuits Conference.

Hourieh Attarzadeh et al, "A Scalable Offset-Cancelled Current/Voltage Sense Amplifier", 2010, IEEE.

Dzahini et al, "Auto-zero stabilized CMOS amplifiers for very low voltage or current offset", 2004 IEEE.

* cited by examiner

SENSE-AMPLIFIER CIRCUIT OF MEMORY AND CALIBRATING METHOD THEREOF

FIELD OF THE INVENTION

The present invention relates to a sense circuit of a storage device, and more particularly to a sense-amplifier circuit of a memory and a calibrating method thereof.

BACKGROUND OF THE INVENTION

With the development of manufacturing process technologies, the present electronic apparatus is required to have a smaller circuit area and a lower operating voltage. Basically, memory is one of the devices in an electronic apparatus that consumes the majority of electrical power due to its complicated and large circuit structure and its high frequency of data reading and writing. Therefore, designing a memory consuming less power and capable of being operated at a relatively low operating voltage is a main challenge for the research and design fellows.

In general, a memory is constituted by a plurality of memory cells, a pre-charge circuit, a write circuit, a row and a column decoders and a sense-amplifier circuit, which is configured to sense the readout contents of the memory cells. However, because the operating voltage is getting lower with the development of manufacturing process technologies and thus the bit lines may have weaker input signals thereat, the sensing range of the sense-amplifier circuit accordingly plays a major role for the memory's efficiency. However, in the manufacturing process, the transistor switches in the sense-amplifier circuit may have a mismatch, so a compensation circuit is usually disposed in the sense-amplifier circuit to eliminate the mismatch effect.

Generally, the compensation circuit may be implemented by digital-to-analog converters; however some problems, such as having a higher cost, accordingly arise due to the complicated feedback control design. Or, the compensation circuit may be implemented by capacitors and switches; however some problems, such as being too sensitive and being easily affected by noise signals so as to resulting in misreading, also arise.

SUMMARY OF THE INVENTION

Therefore, the present invention discloses a sense-amplifier circuit of a memory and a calibrating method using the same. Specifically, a plurality of parallel-coupled n-type metal oxide semiconductor (NMOS) transistor switches are disposed on two sides of a sense-amplifier unit constituted by a plurality of cross-coupled transistor switches to calibrate the sensing range of the sense-amplifier circuit.

Therefore, an embodiment of the present invention provides a sense-amplifier circuit of a memory, which includes a sense-amplifier unit, a first switch unit and a second switch unit. The sense-amplifier unit is constituted by a plurality of transistor switches and having a first connection terminal, a second connection terminal, a third connection terminal and a fourth connection terminal. The first switch unit is configured to be parallel coupled between the first and second connection terminals of the sense-amplifier unit. The second switch unit is configured to be parallel coupled between the third and fourth connection terminals of the sense-amplifier unit. The first and second switch units each are constituted by a plurality of transistor switches coupled in parallel and are configured to control each of the parallel-coupled transistor switches on or off in the first and second switch units so as to calibrate a sensing range of the sense-amplifier unit.

Another embodiment of the present invention provides a calibrating method for a sense-amplifier circuit of a memory as described above, which includes steps of: simultaneously supplying a same voltage signal to the first and third connection terminals of the sense-amplifier unit; detecting a voltage level at each of the first and third connection terminals of the sense-amplifier unit in a next clock sequence and determining whether or not the first and third connection terminals have a same voltage level; and outputting at least a control signal to the parallel-coupled transistor switches gate terminals of which from the control unit if the first connection terminal has a different voltage level from the third connection terminal. The control signal selectively turns on at least a parallel-coupled transistor switch in the first or second switch units so as to calibrate a sensing range of the sense-amplifier unit.

In summary, according to the present invention for a sense-amplifier circuit of a memory and a calibrating method thereof, a control unit facilitates the sensing range of sense-amplifier circuit based on a feedback control through selectively turning on or off one or some of a plurality of parallel-coupled NMOS transistor switches disposed on two sides of a sense-amplifier unit constituted by a plurality of cross-coupled transistor switches. And thus, the sense-amplifier circuit of the present invention can have a shorter data-reading time and the memory can have an enhanced data accessing efficiency consequently.

BRIEF DESCRIPTION OF THE DRAWINGS

The present invention will become more readily apparent to those ordinarily skilled in the art after reviewing the following detailed description and accompanying drawings, in which.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
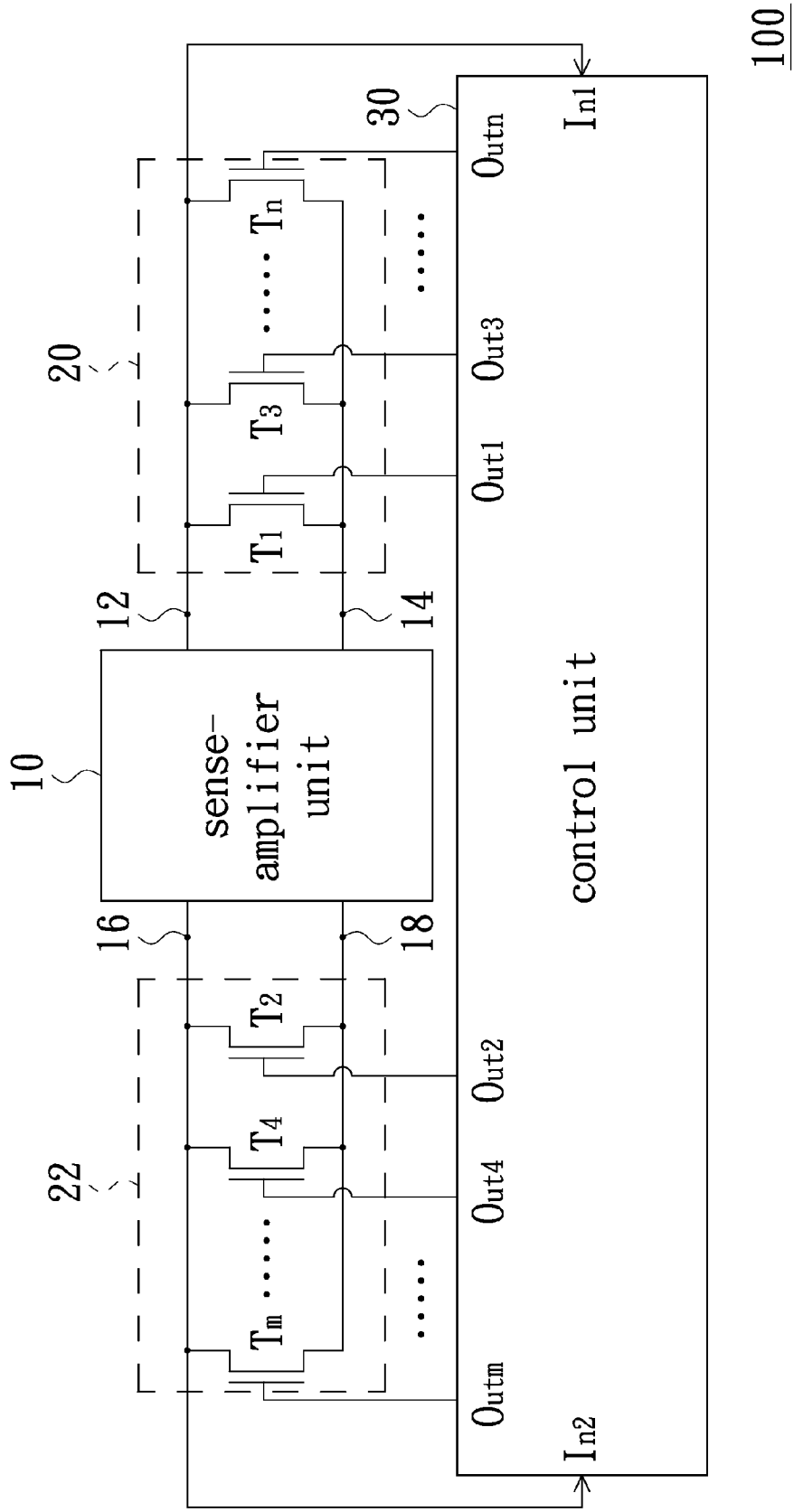
FIG. 1 is a schematic circuit view of a sense-amplifier circuit of a memory in accordance with a first embodiment of the present invention.

FIG. 1 is a schematic circuit view of a sense-amplifier circuit of a memory in accordance with a first embodiment of the present invention. As shown in FIG. 1, the sense-amplifier circuit 100 according to the first embodiment includes a sense-amplifier unit 10, a first switch unit 20, a second switch unit 22 and a control unit 30.

The sense-amplifier unit 10 is constituted by a plurality of cross-coupled transistor switches (not shown) and is configured to sense readout contents of memory cells (not shown) of the memory. Basically, the sense-amplifier unit 10 has either a differential architecture or a non-differential architecture. In addition, the sense-amplifier unit 10 has a first connection terminal 12, a second connection terminal 14, a third connection terminal 16 and a fourth connection terminal 18.

The first switch unit 20 is disposed on a first side (e.g., the right side) of the sense-amplifier unit 10 and is configured to be electrically coupled between the first and second connection terminals 12, 14 of the sense-amplifier unit 10. In particular, the first switch unit 20 is constituted by transistor switches T1, T3, ..., Tn, which are electrically coupled in parallel. In addition, the transistor switches T1, T3, ..., Tn each have, for example, an n-type metal oxide semiconductor (NMOS) architecture. Specifically, the transistor switches T1, T3, ..., Tn each have a drain terminal electrically coupled to the first connection terminal 12 and each have a source terminal electrically coupled to the second connection terminal 14. Moreover, the transistor switches T1, T3, ..., Tn each may have, without a limitation, a same channel width to length ratio (W/L). In the first embodiment of this invention, the transistor switches T1, T3, ..., Tn each are configured to have a same channel aspect ratio.

It is to be noted that, if the transistor switches T1, T3, ..., Tn each have a different channel width to length ratio, the channel width to length ratio of the transistor switch T1 is configured to be, for example, greater than that of the transistor switch T3, the channel width to length ratio of the transistor switch T3 is configured to be, for example, greater than that of its next-stage transistor switch, and so forth; alternatively, the channel width to length ratio of the transistor switch T1 is configured to be, for example, smaller than that of the transistor switch T3, the channel width to length ratio of the transistor switch T3 is configured to be, for example, smaller than that of its next-stage transistor switch, and so forth.

The second switch unit 22 is disposed on a second side (e.g., the left side) of the sense-amplifier unit 10 and is configured to be electrically coupled between the third and fourth connection terminals 16, 18 of the sense-amplifier unit 10. In particular, the second switch unit 22 is constituted by transistor switches T2, T4, ..., Tm, which are electrically coupled in parallel. In addition, the transistor switches T2, T4, ..., Tm each have, for example, a NMOS architecture. Specifically, the transistor switches T2, T4, ..., Tm each have a drain terminal electrically coupled to the third connection terminal 16 and each have a source terminal electrically coupled to the fourth connection terminal 18. Moreover, the transistor switches T2, T4, ..., Tm each may have, without a limitation, a same channel width to length ratio. In the first embodiment of this invention, the transistor switches T2, T4, ..., Tm each are configured to have a same channel width to length ratio. In addition, the transistor switches T1, T3, ..., Tn and the transistor switches T2, T4, ..., Tm each are configured to have a same channel width to length ratio in the first embodiment.

Besides, if the transistor switches T2, T4, ..., Tm each have a different channel width to length ratio, the channel width to length ratio of the transistor switch T2 is configured to be, for example, greater than that of the transistor switch T4, the channel width to length ratio of the transistor switch T4 is configured to be, for example, greater than that of its next-stage transistor switch, and so forth; alternatively, the channel width to length ratio of the transistor switch T2 is configured to be, for example, smaller than that of the transistor switch T4, the channel width to length ratio of the transistor switch T4 is configured to be, for example, smaller than that of its next-stage transistor switch, and so forth. In addition, the channel width to length ratios of the transistor switches T1, T3, ..., Tn in the first switch unit 20 are corresponding to that of the transistor switches T2, T4, ..., Tm in the second switch unit 22, respectively. For example, the transistor switch T1 has a channel width to length ratio equal to the transistor switch T2 has, and the transistor switch T3 has a channel width to length ratio equal to the transistor switch T4 has; but the channel width to length ratio of the transistor switch T1 is smaller than that of the transistor switch T3 and the channel width to length ratio of the transistor switch T2 is smaller than that of the transistor switch T4. In other words, the transistor switch located farther away from the sense-amplifier unit 10 has a smaller channel width to length ratio; and vice versa if some other design requirements are demanded.

The control circuit 30 is configured to electrically couple to the first and second switch units 20, 22 and has a first input terminal In1, a second input terminal In2, output terminals Out1, Out3, ..., Outn and output terminals Out2, Out4, ..., Outm. In particular. the first input terminal In1 is electrically coupled to the drain terminal of the transistor switch Tn and thereby forming a first feedback path from the first switch unit 20 to the control unit 30; and the second input terminal In2 is electrically coupled to the drain terminal of the transistor switch Tm and thereby forming a second feedback path from the second switch unit 22 to the control unit 30. In addition, the output terminals Out1, Out3, ..., Outn are electrically coupled to the gate terminals of the transistor switches T1, T3, ..., Tn in the first switch unit 20 with one to one correspondence; and the output terminals Out2, Out4, ..., Outm are electrically coupled to the gate terminals of the transistor switches T2, T4, ..., Tm in the second switch unit 22 with one to one correspondence.

In the first embodiment, circuit characteristics, such as the sensing range, of the sense-amplifier unit 10 can be obtained in a test phase of an initialization. For example, the sensing range of the sense-amplifier unit 10 can be obtained through simultaneously supplying two same input signals to the sense-amplifier unit 10 and then detecting and determining the two corresponding outputs of the sense-amplifier unit 10 are same or not. If the control circuit 30 via the first and second feedback paths determines that the two outputs of the sense-amplifier unit 10 are not equal, which indicates that the sensing range of the sense-amplifier unit 10 needs a calibration, the control circuit 30 through receiving a feedback voltage from the first feedback path and receiving another feedback voltage from the second feedback path outputs control signals to the first and second switch units 20, 22 via the output terminals Out1, Out3, ..., Outn and output terminals Out2, Out4, ..., Outm thereof to selectively turn on or turn off the transistor switches in the first and second switch units 20, 22, respectively, so as to calibrate the sensing range of the sense-amplifier unit 10. In particular, the control circuit 30 is, with no limitation, constituted by successive approximation registers (SARs).

Besides, in another embodiment, it is to be noted that the control unit 30 can be removed from the sense-amplifier circuit 100 once the sensing range of the sense-amplifier unit 10 has been calibrated and each of the transistor switches T1, T3, ..., Tn and T2, T4, ..., Tm in the first and second switch unit 20, 22 is kept in either a determined turned-on state or a determined turned-off state after the calibration.

Figure 2:
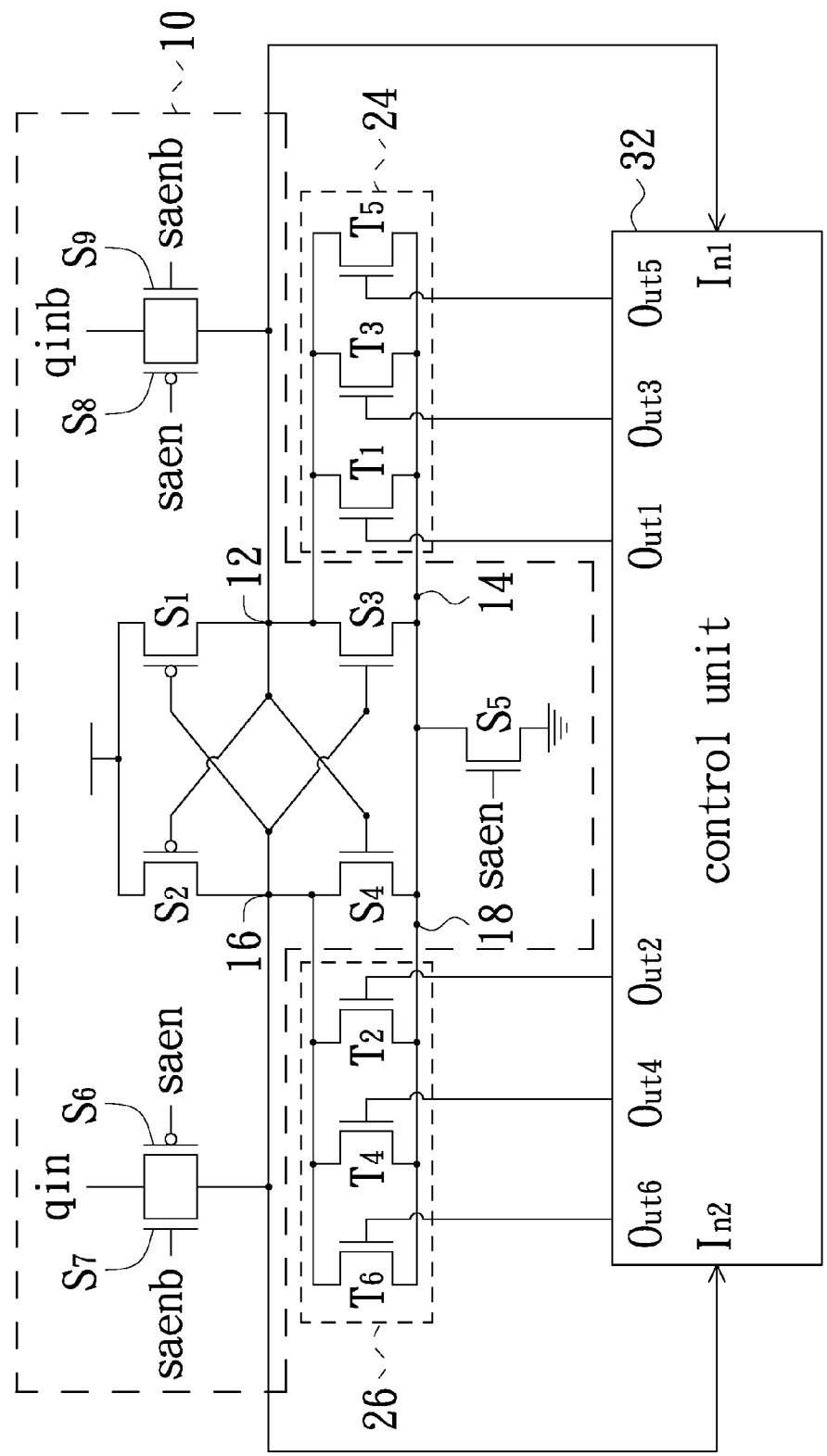
FIG. 2 is a schematic circuit view of a sense-amplifier circuit of a memory in accordance with a second embodiment of the present invention.

FIG. 2 is a schematic circuit view of a sense-amplifier circuit of a memory in accordance with a second embodiment of the present invention. As shown in FIG. 2, the sense-amplifier circuit 110 according to the second embodiment includes a sense-amplifier unit 10, a first switch unit 24, a second switch unit 26 and a control unit 32.

The sense-amplifier unit 10 is constituted by a first switch S1, a second switch S2, a third switch S3, a fourth switch S4, a fifth switch S5, a sixth switch S6, a seventh switch S7, a eighth switch S8 and a ninth switch S9. The first switch S1, second switch S2, sixth switch S6 and eighth switch S8 each have a p-type metal oxide semiconductor (PMOS) architecture; and the third switch S3, fourth switch S4, fifth switch S5, seventh switch S7 and ninth switch S9 each have a NMOS architecture. In addition, it is to be noted that the circuit structure of the sense-amplifier unit 10 in the second embodiment shown in FIG. 2 is only an example, and the circuit structure of the sense-amplifier unit 10 is not limited as such.

The first switch S1, second switch S2, third switch S3 and fourth switch S4 are configured to be cross coupled. Specifically, the first switch S1 has a drain terminal electrically coupled to the first connection terminal 12 and a gate terminal electrically coupled to the third connection terminal 16. The second switch S2 has a drain terminal electrically coupled to the third connection terminal 16, a gate terminal electrically coupled to the first connection terminal 12 and a source terminal electrically coupled to the source terminal of the first switch S1. The third switch S3 has a drain terminal electrically coupled to the first connection terminal 12, a gate terminal electrically coupled to the third connection terminal 16 and a source terminal electrically coupled to the second connection terminal 14. The fourth switch S4 has a drain terminal electrically coupled to the third connection terminal 16, a gate terminal electrically coupled to the first connection terminal 12 and a source terminal electrically coupled to the fourth connection terminal 18. The fifth switch S5 has a drain terminal electrically coupled to the source terminals of the third switch S3 and the fourth switch S4, a gate terminal configured to receive an enable signal saen and a source terminal electrically coupled to ground.

Moreover, the sixth switch S6 has a source terminal configured to receive a bit-line signal qin, a gate terminal configured to receive the enable signal saen and a drain terminal electrically coupled to the third connection terminal 16. The seventh switch S7 has a drain terminal configured to receive the bit-line signal qin, a gate terminal configured to receive a complementary enable signal saenb and a source terminal electrically coupled to the third connection terminal 16. The eighth switch S8 has a source terminal configured to receive a complementary bit-line signal qinb, a gate terminal configured to receive the enable signal saen and a drain terminal electrically coupled to the first connection terminal 12. The ninth switch S9 has a drain terminal configured to receive the complementary bit-line signal qinb, a gate terminal configured to receive the complementary enable signal saenb and a source terminal electrically coupled to the first connection terminal 12. Furthermore, the first and third connection terminals 12, 16 are also electrically coupled to the first and second input terminals In1, In2 of the control unit 32, respectively.

The first switch unit 24 is configured to electrically couple to the sense-amplifier unit 10 and the control unit 32 and includes transistor switches T1, T3 and T5. Specifically, the transistor switches T1, T3 and T5 each have a drain terminal electrically coupled to the first connection terminal 12; each have a source terminal electrically coupled to the second connection terminal 14; and each have a gate terminal electrically coupled to the output terminals Out1, Out3 and Out5 of the control unit 32, respectively.

It is to be noted that in the second embodiment, the transistor switch T1 has a channel width to length ratio greater than the transistor switch T3 has; and the transistor switch T3 has a channel width to length ratio greater than the transistor switch T5 has. Specifically, the currents flowing through the turned-on transistor switches T1, T3 and T5 can have, for example, a ratio of 4:2:1. In addition, because in the first switch unit 24 the transistor switch T1 is closest to the first and second connection terminals 12, 14 relative to the transistor switches T3, T5, the transistor switch T1 in the present embodiment is referred to as an innermost transistor switch in the first switch unit 24.

The second switch unit 26 is configured to electrically couple to the sense-amplifier unit 10 and the control unit 32 and includes transistor switches T2, T4 and T6. Specifically, the transistor switches T2, T4 and T6 each have a drain terminal electrically coupled to the third connection terminal 16; each have a source terminal electrically coupled to the fourth connection terminal 18; and each have a gate terminal electrically coupled to the output terminals Out2, Out4 and Out6 of the control unit 32, respectively.

It is to be noted that in the second embodiment, the transistor switch T2 has a channel width to length ratio greater than the transistor switch T4 has; and the transistor switch T4 has a channel width to length ratio greater than the transistor switch T6 has. Specifically, the currents flowing through the turned-on transistor switches T2, T4 and T6 can have, for example, a ratio of 4:2:1. In addition, because in the second switch unit 26 the transistor switch T2 is closest to the third and fourth connection terminals 16, 18 relative to the transistor switches T4, T6, the transistor switch T2 in the present embodiment is referred to as an innermost transistor switch in the second switch unit 26.

Figure 3:
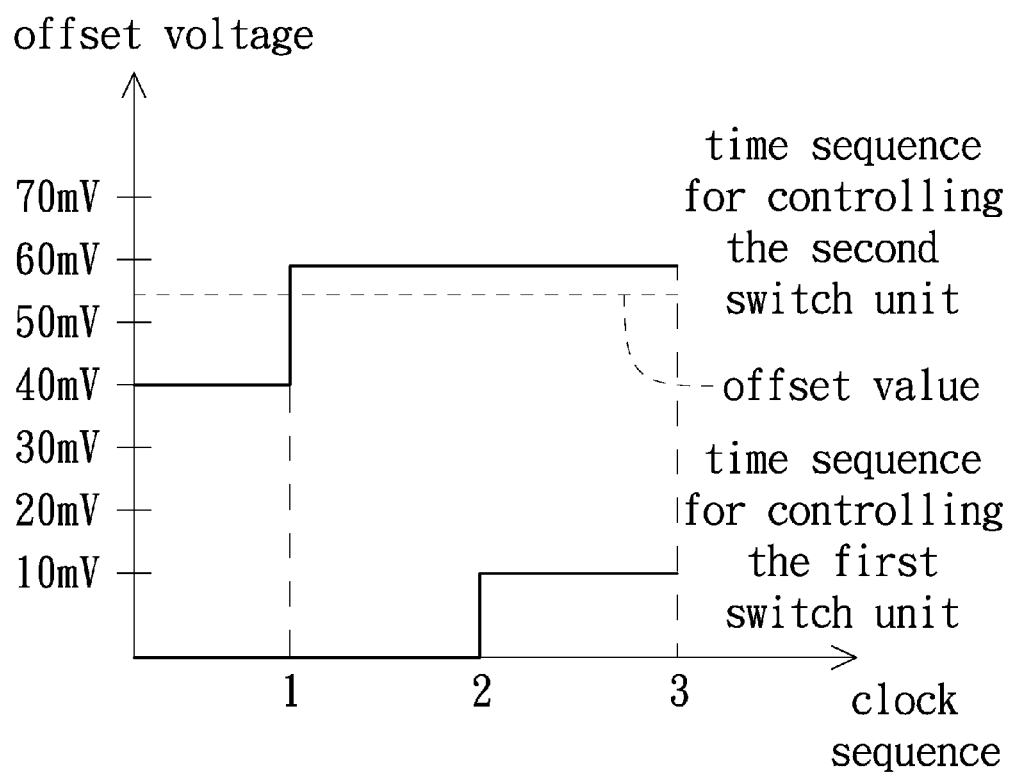
FIG. 3 is a schematic timing sequence view exemplarily illustrating the control signals for controlling the first and second switch units in the sense-amplifier circuit in accordance with the second embodiment of the present invention.

FIG. 3 is a schematic timing sequence view exemplarily illustrating the control signals for controlling the first and second switch units 24, 26 in the sense-amplifier circuit 110 in accordance with the second embodiment of the present invention. Please refer to FIGS. 2, 3. In the test phrase of an initiation, firstly the complementary bit-line signal qinb and the bit-line signal qin with a same voltage value are simultaneously supplied to the first and third connection terminals 12, 16, respectively, and then the logic levels at the first and third connection terminals 12, 16 in a next clock sequence are obtained. Through the obtainment and comparison of the two logic levels at the first and third connection terminals 12, 16, the control unit 32 can determine whether or not the sense-amplifier unit 10 needs a calibration. For example, if the first connection terminal 12 is detected to have a logic level of "0" (or, logic-low) and the third connection terminal 16 is detected to have a logic level of "1" (or, logic-high), the control unit 32 can determine that a calibration needs to perform on the sense-amplifier unit 10.

To get a clear understanding the sense-amplifier circuit 110 of the second embodiment, in the following the calibration performed by the control unit 32 on the sense-amplifier unit 10 is exemplarily completed in three clock sequences. As described above, the first connection terminal 12 has a logic-low thereat and the third connection terminal 16 has a logic-high thereat, so the control unit 32 is configured to output a logic-high control signal through the output terminal Out2 thereof to turn on the transistor switch T2 in the clock sequence 1 so as to lower the voltage value at the third connection terminal 16; on the other hand, the control unit 32 in the clock sequence 1 is also configured to output a logic-low control signal through the output terminal Out1 thereof to keep the transistor switch T1 at a turned-off state.

Afterwards, if the control unit 32 through the first and second feedback paths detects that neither of the first and second connection terminals 12, 16 has a logic-level transition, in other words, the first connection terminal 12 still has a logic-low thereat and the third connection terminal 16 still has a logic-high thereat, the control unit 32 is configured to output a logic-high control signal through the output terminal Out4 thereof to turn on the transistor switch T4 in the clock sequence 2 so as to further lower the voltage value at the third connection terminal 16; on the other hand, the control unit 32 in the clock sequence 2 is also configured to output a logic-low control signal through the output terminal Out3 thereof to keep the transistor switch T3 at a turned-off state.

Afterwards, when the second switch unit 26 has an offset voltage larger than the offset value, the logic-level variations at the first and second connection terminals 12, 16 can be determined through the first and the second feedback paths, respectively. Therefore, the control unit 32 is configured to output a logic-high control signal through the output terminal Out5 thereof to turn on the transistor switch T5 in the clock sequence 3 so as to lower the voltage value at the first connection terminal 12; on the other hand, the control unit 32 in the clock sequence 3 is also configured to output a logic-low control signal through the output terminal Out6 thereof to keep the transistor switch T6 at a turned-off state.

Figure 4A:
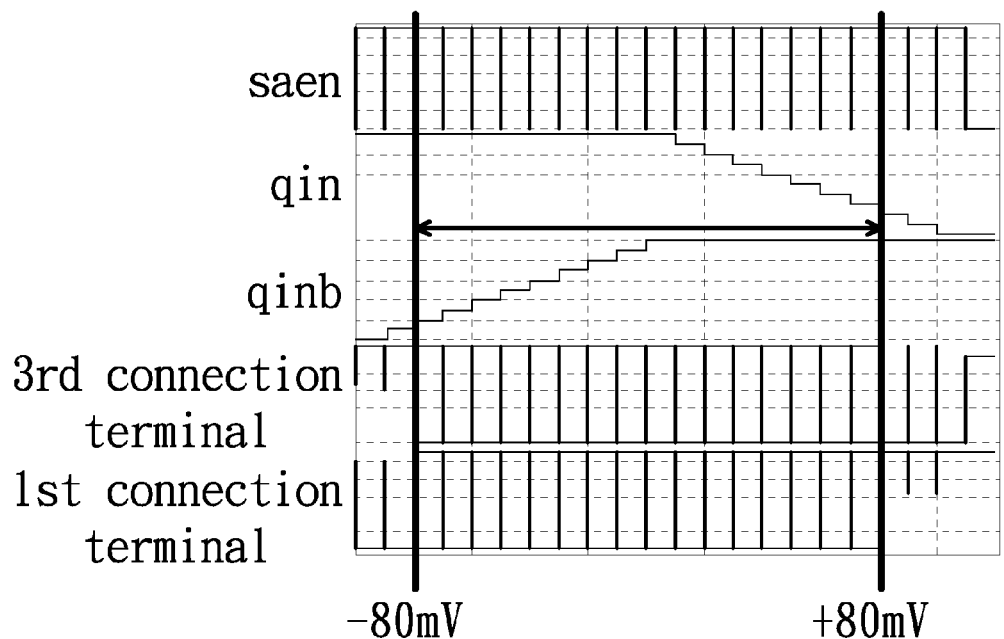
FIG. 4A is a schematic plot simulating the signal waveforms at specific terminals of a conventional sense-amplifier circuit.
Figure 4B:
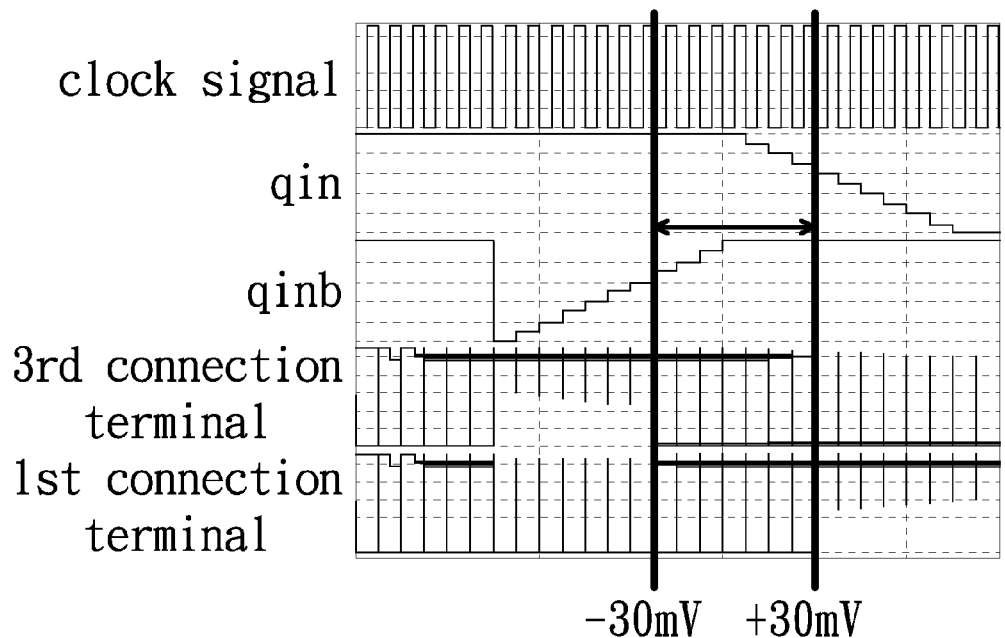
FIG. 4B is a schematic plot simulating the signal waveforms at specific terminals of the sense-amplifier circuit in accordance with an embodiment of the present invention.

FIG. 4A is a schematic plot simulating the signal waveforms at specific terminals of a conventional sense-amplifier circuit. FIG. 4B is a schematic plot simulating the signal waveforms at specific terminals of the sense-amplifier circuit in accordance with an embodiment of the present invention. As shown in FIG. 4A, without a calibration the conventional sense-amplifier circuit has a sensing range roughly between −80 mv to +80 mv. As shown in FIG. 4B, the sense-amplifier circuit 100 (shown in FIG. 1) of the present invention has a sensing range narrowed down between −30 mv to +30 mv after being calibrated by the first switch unit 10, second switch unit 20 and control unit 30. As a result, the sense-amplifier circuit 100 of the present invention has a data-reading time 37.5% shorter than that of the conventional sense-amplifier circuit so as to enhance the data accessing efficiency of the memory.

Figure 5A:
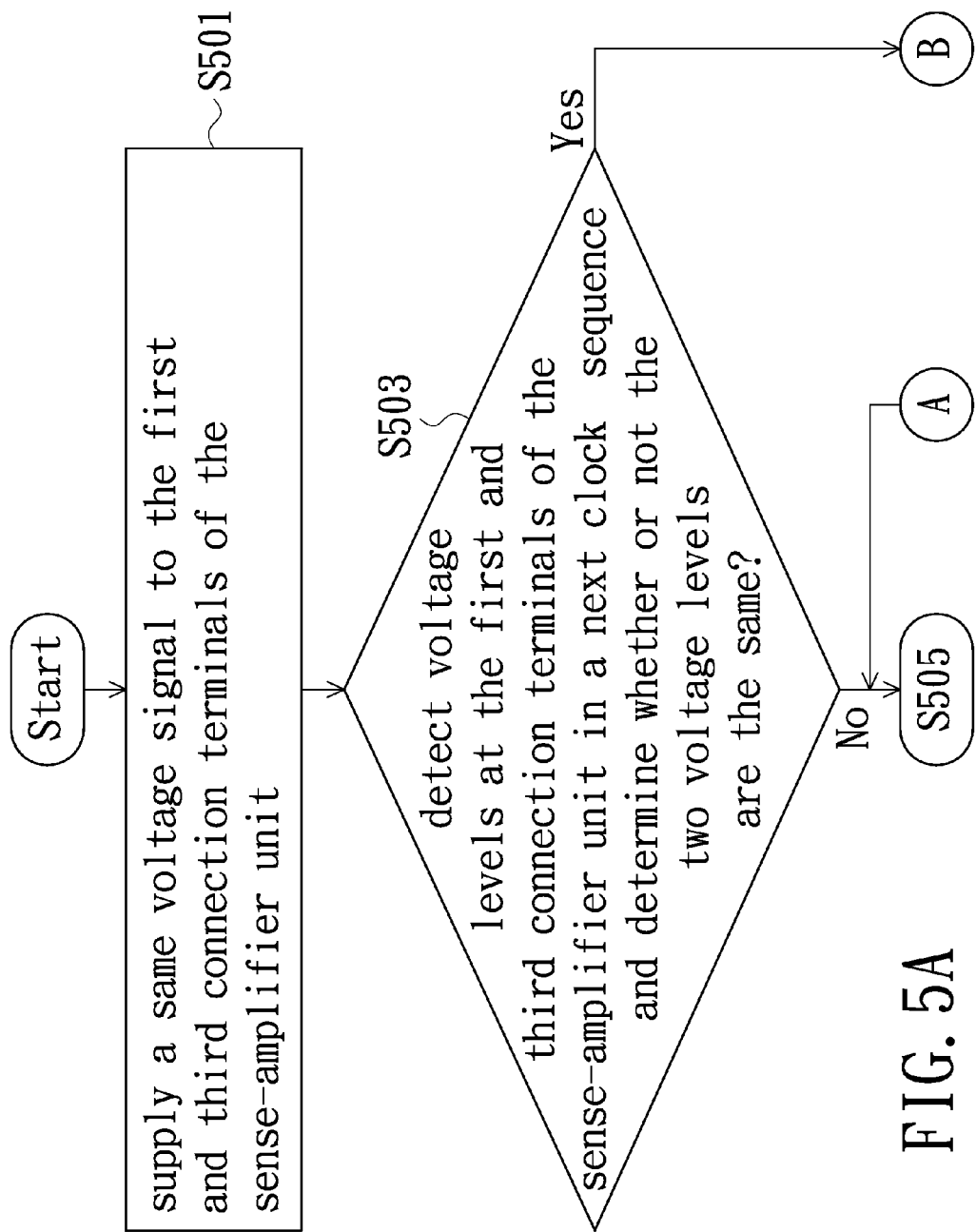
FIGS. 5A, 5B and 5C are schematic flow charts of a calibrating method for a sense-amplifier circuit of a memory in accordance with an embodiment of the present invention.
Figure 5B:
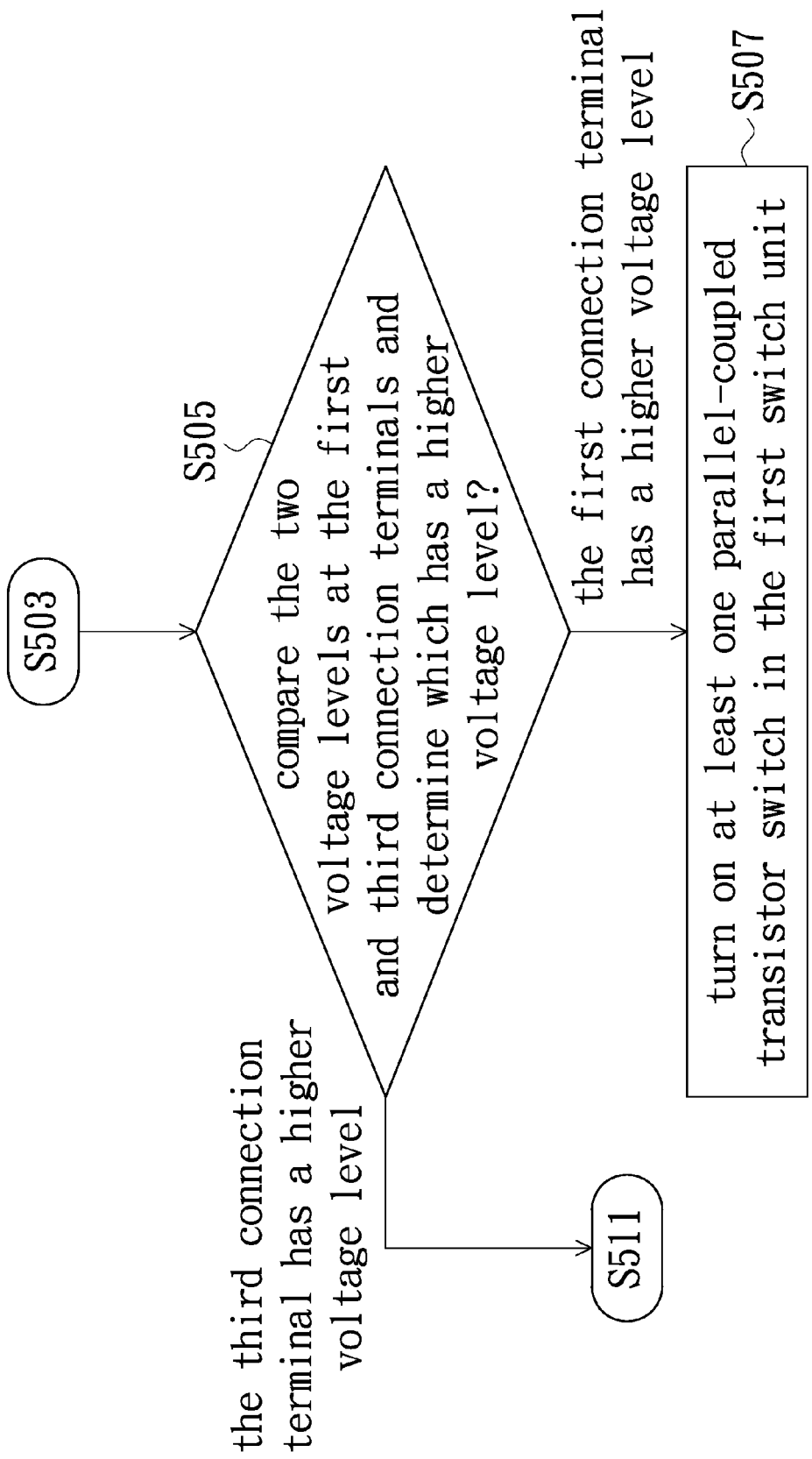
Figure 5C:
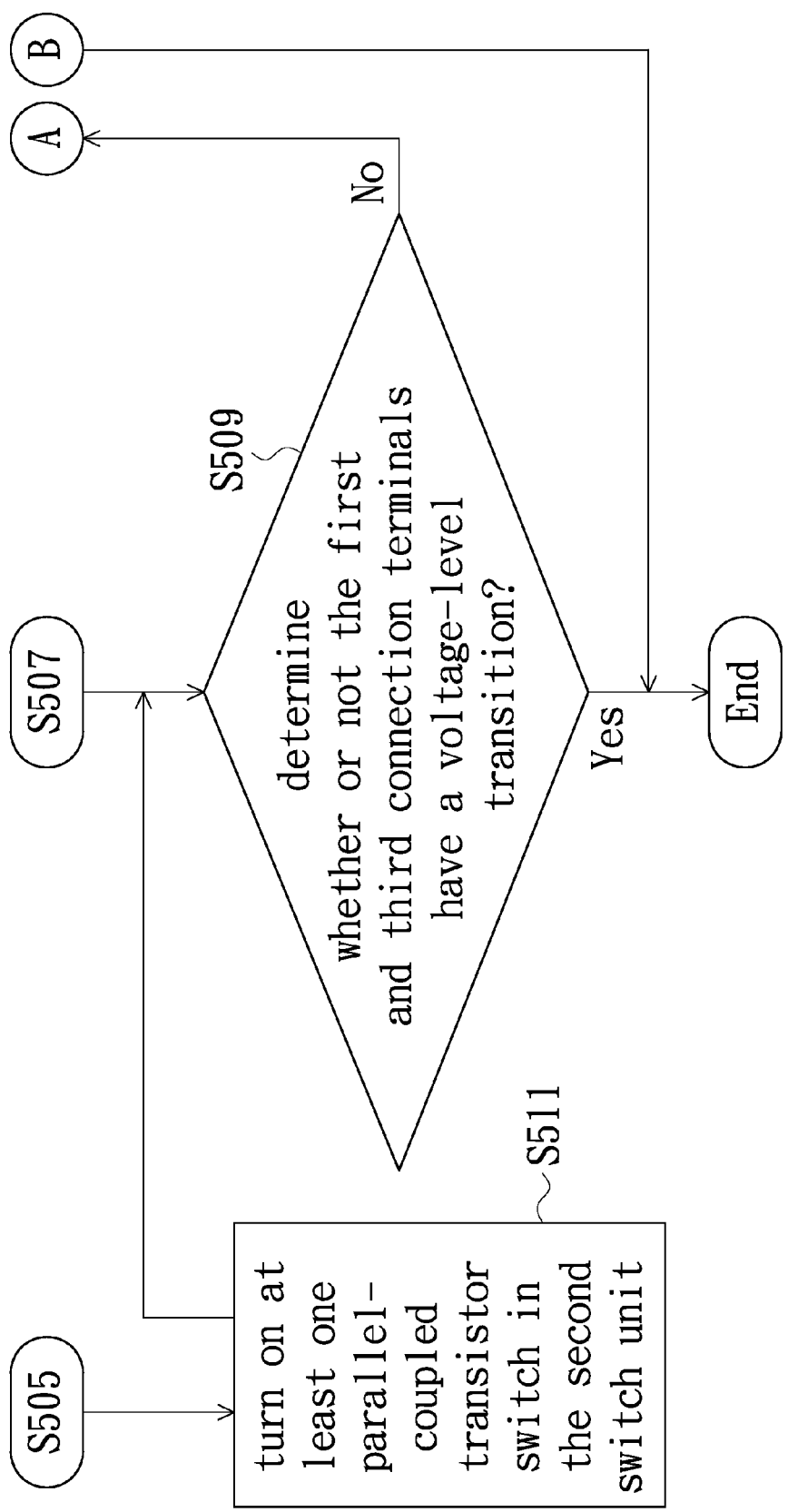

FIGS. 5A, 5B and 5C are schematic flow charts of a calibrating method for a sense-amplifier circuit of a memory in accordance with an embodiment of the present invention. Please refer to FIGS. 1, 5A, 5B and 5C, firstly, a voltage signal is simultaneously supplied to the first and third connection terminals 12, 16 of the sense-amplifier circuit 10 to preliminary test the sense-amplifier unit 10 so as to determine whether or not the sense-amplifier unit 10 needs a calibration (step S501).

Next, the voltage level (or logic level) at each of the first and third connection terminals 12, 16 of the sense-amplifier circuit 10 is detected and compared in a next clock sequence so as to determine whether or not the two voltage levels are the same (step S503). Specifically, the calibrating method according to the present embodiment is end herein if the first and third connection terminals 12, 16 each have a same voltage level.

If the two voltage levels are not the same, the two voltage levels are compared with each other thereby determining that which one of the first and third connection terminals 12, 16 has a higher voltage level (step S505); wherein the detection and determination of the two voltage levels can be performed by the control unit 30 based on the feedback currents transmitted from the two feedback paths. If the detected voltage level at the first connection terminal 12 is higher than that at the third connection terminal 16, the control unit 30 then outputs at least a specific control signal to the first switch unit 20 to selectively turn on one or some of the parallel-coupled transistor switches T1, T3, . . . , Tn in the first switch unit 20 (step S507) for the calibration of the sensing range of the sense-amplifier circuit unit 10. Alternatively, if the voltage level at the third connection terminal 16 is higher than that at the first connection terminal 12, the control unit 30 then outputs at least a specific control signal to the second switch unit 22 to selectively turn on one or some of the parallel-coupled transistor switches T2, T4, . . . , Tm in the second switch unit 22 (step S511), for the calibration of the sensing range of the sense-amplifier circuit unit 10.

Afterwards, the control unit 30 through the two feedback paths determines that whether or not the first connection terminal 12 and the third connection terminal 16 have a voltage-level transition (step S509). If the first connection terminal 12 or the third connection terminal 16 has a voltage-level transition, then the calibrating method according to the present embodiment herein is end. Alternatively, the calibrating method according to the present embodiment goes to step S505 to determine that which one of the first and third connection terminals 12, 16 has a higher voltage level.

To sum up, according to the present invention for a sense-amplifier circuit of a memory and a calibrating method thereof, a control unit facilitates the sensing range of sense-amplifier circuit based on a feedback control through selectively turning on or off one or some of a plurality of parallel-coupled NMOS transistor switches disposed on two sides of a sense-amplifier unit constituted by a plurality of cross-coupled transistor switches. And thus, the sense-amplifier circuit of the present invention can have a shorter data-reading time and the memory can have an enhanced data accessing efficiency consequently.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A sense-amplifier circuit of a memory, comprising:
a sense-amplifier unit constituted by a plurality of transistor switches and having a first connection terminal, a second connection terminal, a third connection terminal and a fourth connection terminal;
a first switch unit configured to be parallel coupled between the first and second connection terminals of the sense-amplifier unit; and
a second switch unit configured to be parallel coupled between the third and fourth connection terminals of the sense-amplifier unit;
wherein the first and second switch units each are constituted by a plurality of transistor switches coupled in parallel and are configured to control each of the parallel-coupled transistor switches on or off in the first and second switch units so as to calibrate a sensing range of the sense-amplifier unit.

2. The sense-amplifier circuit according to claim 1, further comprising:
a control unit configured to electrically couple to the first and third connection terminals of the sense-amplifier unit thereby forming a first feedback path and a second feedback path, respectively, the control unit having a plurality of output terminals configured to electrically couple to the parallel-coupled transistor switches gate terminals of which in the first and second switch units with one to one correspondence;

wherein the control unit is configured to receive two feedback voltages from the first and second feedback paths and accordingly generate control signals for turning on the parallel-coupled transistor switches in the first and second switch units.

3. The sense-amplifier circuit according to claim 2, wherein the sense-amplifier unit further comprises:

a first switch having a drain terminal electrically coupled to the first connection terminal and a gate terminal electrically coupled to the third connection terminal;

a second switch having a drain terminal electrically coupled to the third connection terminal, a gate terminal electrically coupled to the first connection terminal and a source terminal electrically coupled to the source terminal of the first switch;

a third switch having a drain terminal electrically coupled to the first connection terminal, a gate terminal electrically coupled to the third connection terminal and a source terminal electrically coupled to the second connection terminal;

a fourth switch having a drain terminal electrically coupled to the third connection terminal, a gate terminal electrically coupled to the first connection terminal and a source terminal electrically coupled to the fourth connection terminal;

a fifth switch having a drain terminal electrically coupled to both the source terminals of the third and fourth switches, a gate terminal configured to receive an enable signal and a source terminal electrically coupled to ground;

a sixth switch having a source terminal configured to receive a bit-line signal, a gate terminal configured to receive the enable signal and a drain terminal electrically coupled to the third connection terminal;

a seventh switch having a drain terminal electrically coupled to the source terminal of the sixth switch, a gate terminal configured to receive a complementary bit-line signal and a source terminal electrically coupled to the third connection terminal;

an eighth switch having a source terminal configured to receive a complementary bit-line signal, a gate terminal configured to receive the enable signal and a drain terminal electrically coupled to the first connection terminal; and a ninth switch having a drain terminal electrically coupled to the source terminal of the eighth switch, a gate terminal configured to receive the complementary enable signal and a source terminal electrically coupled to the first connection terminal;

wherein the first and second connection terminals are further configured to be electrically coupled to a first and a second input terminals of the control unit so as to form the first and second feedback paths, respectively.

4. The sense-amplifier circuit according to claim 1, wherein the parallel-coupled transistor switches in the first and second switch units each have a same channel width to length ratio.

5. The sense-amplifier circuit according to claim 1, wherein the parallel-coupled transistor switches in the first and second switch units each have a different channel width to length ratio.

6. The sense-amplifier circuit according to claim 1, wherein the first and second switch units each have a same number of parallel-coupled transistor switches.

7. The sense-amplifier circuit according to claim 1, wherein in the first switch unit the innermost transistor switch has a greatest width to length ratio relative to the rest transistor switches, and in the second switch unit the innermost transistor switch has a greatest width to length ratio relative to the rest transistor switches.

8. The sense-amplifier circuit according to claim 7, wherein the innermost transistor switch in the first switch unit has a channel width to length ratio equal to that of the innermost transistor switch in the second switch unit.

9. A calibrating method for a sense-amplifier circuit, comprising steps of:

providing the sense-amplifier circuit, comprising:

a sense-amplifier unit constituted by a plurality of transistor switches and having a first connection terminal, a second connection terminal, a third connection terminal and a fourth connection terminal;

a first switch unit configured to be parallel coupled between the first and second connection terminals of the sense-amplifier unit;

a second switch unit configured to be parallel coupled between the third and fourth connection terminals of the sense-amplifier unit; and a control unit configured to electrically couple to the first and third connection terminals of the sense-amplifier unit thereby forming a first feedback path and a second feedback path, respectively, the control unit having a plurality of output terminals configured to electrically couple to the parallel-coupled transistor switches gate terminals of which in the first and second switch units with one to one correspondence;

simultaneously supplying a same voltage signal to the first and third connection terminals of the sense-amplifier unit;

detecting a voltage level at each of the first and third connection terminals of the sense-amplifier unit in a next clock sequence and determining whether or not the first and third connection terminals have a same voltage level; and outputting at least a control signal to the parallel-coupled transistor switches gate terminals of which from the control unit if the first connection terminal has a different voltage level from the third connection terminal, wherein the control signal selectively turns on at least a parallel-coupled transistor switch in the first or second switch units so as to calibrate a sensing range of the sense-amplifier unit.

10. The calibrating method for a sense-amplifier circuit of a memory according to claim 9, wherein the control signal turns on at least a parallel-coupled transistor switch in the first switch unit if the first connection terminal has a higher voltage level than the third connection terminal has.

11. The calibrating method for a sense-amplifier circuit of a memory according to claim 9, wherein the control signal turns on at least a parallel-coupled transistor switch in the second switch unit if the third connection terminal has a higher voltage level than the first connection terminal has.

* * * * *